United States Patent [19]

Rowe et al.

[11] Patent Number: 4,640,884
[45] Date of Patent: Feb. 3, 1987

[54] PHOTOSENSITIVE COMPOUNDS AND LITHOGRAPHIC COMPOSITION OR PLATE THEREWITH HAVING O-QUINONE DIAZIDE SULFONYL ESTER GROUP

[75] Inventors: William Rowe, Califon; Thomas Dooley, Teaneck, both of N.J.

[73] Assignee: Polychrome Corp., Yonkers, N.Y.

[21] Appl. No.: 717,988

[22] Filed: Mar. 29, 1985

[51] Int. Cl.$^4$ .................. G03C 1/54; C07C 35/22; C07C 113/00
[52] U.S. Cl. .................. 430/165; 430/141; 430/166; 430/189; 430/192; 430/193; 430/302; 534/556; 534/557; 534/561; 534/563; 568/818
[58] Field of Search ........... 430/193, 192, 189, 141, 430/302, 165, 166; 534/556, 558, 561, 563, 557; 568/818

[56] References Cited

U.S. PATENT DOCUMENTS

| | | | |
|---|---|---|---|
| 3,046,113 | 7/1962 | Schmidt et al. | 430/193 |
| 3,342,880 | 9/1967 | Reinhardt | 568/818 |
| 3,398,165 | 8/1968 | Duling et al. | 568/818 |
| 3,494,767 | 2/1970 | Laridon et al. | 430/193 |
| 3,567,451 | 3/1971 | Borden et al. | 430/193 |
| 3,594,427 | 7/1971 | Moore | 528/190 |
| 3,635,709 | 1/1972 | Kobayashi | 430/192 |
| 3,637,384 | 1/1972 | Deutsch et al. | 430/192 |
| 3,687,663 | 8/1972 | Bloom | 430/193 |
| 3,802,885 | 4/1974 | Lawson et al. | 430/193 |
| 4,522,911 | 6/1975 | Clecak et al. | 430/192 |

FOREIGN PATENT DOCUMENTS

WO81/03657 12/1981 PCT Int'l Appl. .

*Primary Examiner*—Charles L. Bowers, Jr.

[57] ABSTRACT

Quinone diazide derivatives of adamantane, and especially quinone diazide derivatives of 1,3-dialkyl-5,7-bis(-hydroyphenol) adamantanes, have been found to provide unique properties when coated on metal substrate in the preparation of both positive and negative working lithographic plates. The improved lithographic plates are characterized by enhanced speed, coating oleophilicity, alkali resistance, developer latitude and development speed.

9 Claims, No Drawings

PHOTOSENSITIVE COMPOUNDS AND LITHOGRAPHIC COMPOSITION OR PLATE THEREWITH HAVING O-QUINONE DIAZIDE SULFONYL ESTER GROUP

BACKGROUND OF THE INVENTION

The present invention relates to novel compounds having light sensitive properties. More particularly, the invention pertains to certain adamantane derivatives which have the ability to enhance the light-exposure speed of lithographic plates as well as enhancing the desirable oleophilicity characteristics of lithographic coating compositions.

As set forth in U.S. Pat. No. 3,652,272, it is well known in lithography to coat a prepared or pre-treated base or support material, such as a resin-coated paper stock or a protectively coated metal plate, with a sensitizer or photosensitive layer. Then the photosensitive surface can be used as such, or it can be protectively coated, for instance with lacquer or a resin layer, to increase its resistance to abrasion, handling, and smudging or other stresses. When the photosensitized plate is exposed to a suitable light source through a transparency or a means for selective transmission of such light, image and non-image areas are formed; and thereafter the plate is developed to provide oleophilic, ink-receiving areas and hydrophilic, ink repellent areas, so that it can be used on a lithographic press.

The present invention has as one of its objects to provide novel adamantane derivatives suitable as sensitizers in the lithographic arts.

Another object of the present invention is to provide a method for preparing these novel adamantane derivatives.

A further object is to provide photosensitive compositions that are useful as coatings for lithographic substrates.

These and other objects of the present invention will become readily apparent from the ensuing description and illustrative embodiments.

SUMMARY OF THE INVENTION

In accordance with the present invention there have been discovered novel adamantane derivatives having the following structural formula

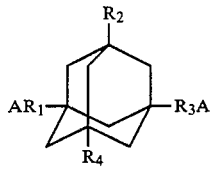

wherein, $R_2$ and $R_4$ are hydrogen, an alkyl group have from 1 to 20 carbon atoms; phenyl; cycloalkyl having at least 6 carbon atoms;

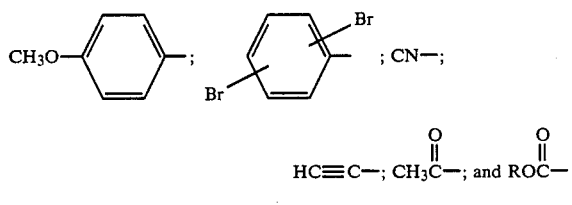

where R is an alkyl group having from 1 to 20 carbon atoms or an aryl group having at least 6 carbon atoms; wherein $R_1$ and $R_3$ may be the same or different and are hydrogen,

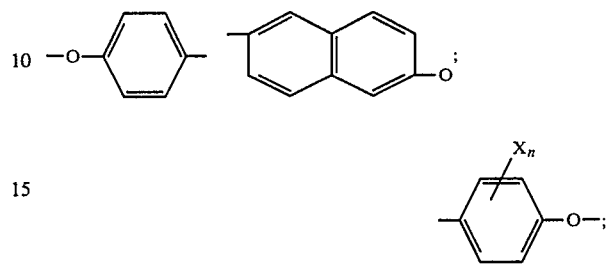

except that $R_1$ and $R_3$ may not both be hydrogen, and where X is a halogen and n is 1 and 4; and wherein A is a quinone diazide such as

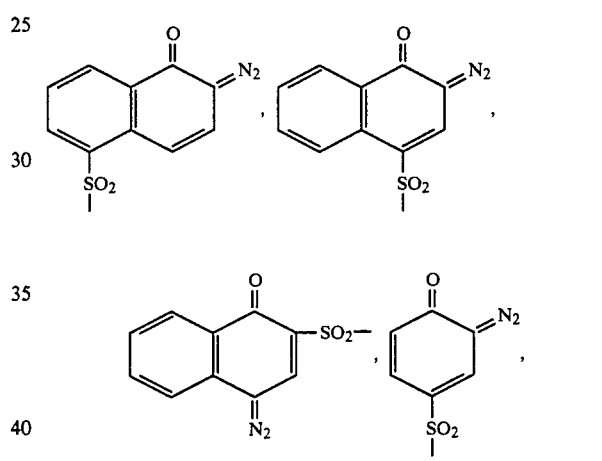

DETAILED DESCRIPTION OF THE INVENTION

As disclosed in the 1981 published patent application PCT EP/81/00066 (Int. Publication No. WO 81/03657) adamantane is commercially available. One of the illustrated methods of adamantane preparation involves the hydrogenation of dimethyl dicyclopentadiene, for example, with the subsequent rearrangement of the hydrogenated tricyclo compound in the presence of Lewis acids into dimethyladamantane.

The resulting dialkyladamantane, such as the dimethyladamantane, can be converted to the dibrominated compound

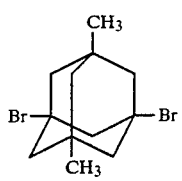

U.S. Pat. No. 3,594,427 discloses that the dibromodialkyladamantane, e.g. dibromo-dimethyladamantane, can be reacted with phenols to give the bis-hydroxyphenyl derivatives:

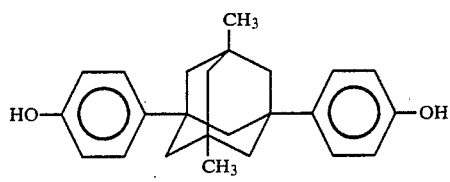

Although the dimethyladamantane derivatives are preferred for most purposes, it should be appreciated that other lower alkyl substituents could be used in place of the methyl groups. Non-alkylated substituents can also be used such as hydrogen as well as the other $R_2$ and $R_4$ substituents described above. Nevertheless, the preferred dimethyladamantane derivative will be utilized to illustrate various aspects of the present invention.

One desired derivative of the invention is obtained by reacting the bis(hydroxylphenyl)dimethyladamantane with a diazo compound or monomer such as 1,2-naphthoquinone-(2)-diazo-4 or 5-sulfonyl chloride, hereinafter referred to as 4 DC and 5 DC, respectively. An illustrative reaction is illustrated below

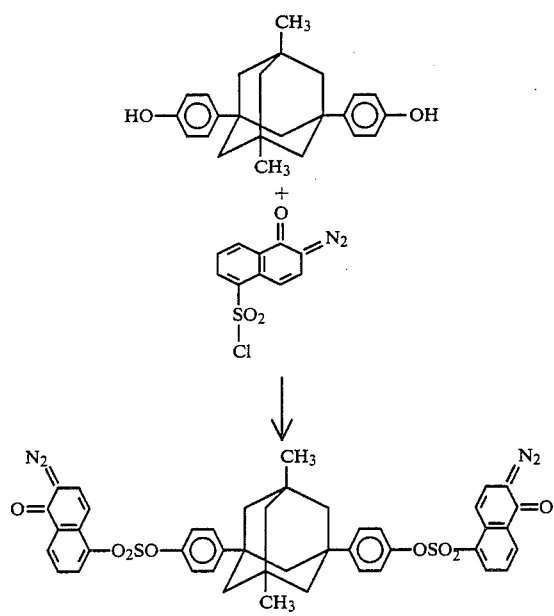

1,3 dimethyl-5,7-bis(1,2-naphthoquinone)-(2)-diazo-5-sulfonyl phenyoxy adamantane. The product is referred to as APS II hereinafter Other diazo compounds that may be employed in the above reaction include 1,2-Naphthoquinone-(2) -diazo-5-sulfonyl chloride
1,2 Naphthoquinone-(2) -diazo-4-sulfonyl chloride
1,4 Naphthoqunione-(4)-diazo-2-sulfonyl chloride
1,2 Benzoquinone-(2)-diazo-4-sulfonyl chloride
1,2 Benzoquinone-(2)-diazo-4-chlor-6-sulfonyl chloride
and the like In general, the reaction is carried out under conditions such as the room temperature esterification of the mono or bis phenol adamantane with any of the quinone diazides mentioned above. A solvent for the reaction is 2 methoxy ethyl ether. Other solvents can be used i.e., methyl ethyl ketone, tetrahydrofuran, and the like and are known to those skilled in the art. Triethylamine is used to scavenge the hydrochloric acid. The reaction is monitored by thin layer chromotography and is complete upon the absence of the quinone diazide in the chromotography test. The triethylamine hydrochloride is removed by filtration prior to precipitation of the product. The product is precipitated in a dilute sodium chloride solution. The product is then obtained by vacuum filtration and washed with water or alcohol and dried to less than 2% moisture. The mole ratio of the reactants are such as to yield an ester with an extinction coefficient ($\epsilon$ 340 NM) between 7.0 and 22.5.

When the novel adamantane derivatives of the present invention are used in formulating photosensitive compositions, in accordance with the method described above, for coating lithographic substrates they are admixed with conventional materials and solvents. Thus, for example, a basic solids and solvents formulation would be as follows:

| Solids | % w/w |
|---|---|
| APS II[1] | 10 to 25 |
| Alnovol PN-430[2] | 70 to 85 |
| Estane 5715[3] | 0 to 6 |
| Triazine D[4] | 0 to 3 |
| D-11[5] | 0.5 to 3 |

[1]1,3 dimethyl-5,7 bis-1,2-naphthoquinone-(2)-diazo-5 sulfonyl phenoxy adamantane.
[2]Phenol-formaldehyde resin (Hoechst)
[3]Urethane Polymer (Goodrich)
[4]2,4 bis (trichloromethyl)-6-styryl-5-triazine
[5]Victoria Blue -2-hydroxy-4-methoxy benzophenone 5 sulfonate reaction products.

| Solvents | Vol., % |
|---|---|
| Methyl Ethyl Ketone | 10 to 50 |
| Methyl Isobutyl Ketone | 20 to 50 |
| Primary Amyl Acetate | 20 to 50 |
| Ethylene Glycol Ethyl Ether | 10 to 30 |

The lithographic plate substrate is preferably a metal such as aluminum and it is generally coated with from about 1.5 to 3.0 grams/m² of the above composition. The coating is dried at temperatures of from 60° to 90° C., and drying usually occurs in less than 30 minutes, often in 15 minutes or less.

The photosensitive products of the present invention have been found to have a number of highly desirable advantages over photosensitive compositions that are currently used commercially. Firstly, the coated lithographic plate is capable of considerably faster exposure speeds than conventional plates. Another advantage is the resulting higher oleophilicity, i.e. ink receptivity. Improved alkali stability and developer latitude are additional advantages.

The invention will be more fully understood by reference to the following illustrative embodiments.

EXAMPLE I

The monoester was prepared by reacting approximately 0.01 mole of bis(phenol)-dimethyladamantane with 0.01 mole of 1,2-naphthquinone-(2)-diazo-5-sulfonyl chloride in diglyme using triethylamine as the base. The monoester referred to hereinafter as APS I.

The diester was prepared by reacting. 0.01 mole of the bis(phenol)-dimethyladamantane with 0.02 mole of 1,2-naphthoquinone-(2)-diazo-5-sulfonyl chloride in diglyme using triethylamine as the base. The diester is referred to hereinafter as APS-II.

Positive-working photosensitive compositions having an equal content of o-quinone-diazide groups, i.e. the light sensitive group of the formulation, were prepared using compounds of the instant invention, and for comparison, two other light sensitive diazo oxide compounds used as components in resists on commercially available positive plates.

The chemical reaction taking place when o-quinonediazides are exposed to light has been described by O.Siis-Liebigs Ann Chem. 556 65–84, 84–90 (1944) as follows:

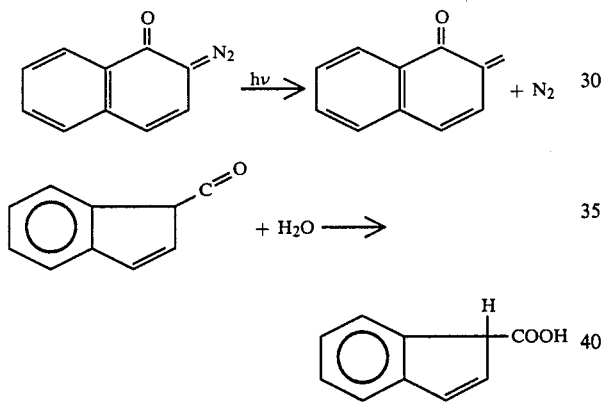

The o-quinone-diazide forms the indene carboxylic acid, which is soluble in alkali, with the liberation of nitrogen during photolysis in the presence of moisture.

In Table A the photosensitive components are set forth while Table B contains the comparative data obtained by testing the coated aluminum lithographic plates.

TABLE A

| Component | | Ext. Coeff. 340 NM. |
| --- | --- | --- |
| 1. P-3000 | U.S.P. 3,635,709 | 13.2 Ex. 4 |
| 2. 2,3,4-trishydroxy-benzophenone-DC | U.S.P. 3,802,885 | 30.4 Ex. 3 |
| 3. APS I | Present Invention | 13.9 Ex. 2 |
| 4. APS II | Present Invention | 20.7 Ex. 1 |
| 5. APS II-4 DC | Present Invention | 17.5 Ex. 5 |

EXAMPLE I

An electrolytically grained and anodically oxidized aluminum plate having an oxid layer weighing about 3 g/m² was treated according to U.S. Pat. No. 4,446,221. A filtered solution of the following preparation,
  2.1 parts naphthoquinone diazide sulfonic acid ester (component No. 4)
  7.3 parts phenol/formaldehyde novolac having a melting range of 110°–120° C. according to DIN 53181-(PN-430 Hoechst A.G.)
  0.2 parts of ESTANE 5715 (Goodrich)
  0.2 parts of Victoria Blue BO
  90.2 parts of a solvent mixture comprising
    4 parts by volume methyl ethyl ketone
    2 parts by volume methyl isobutyl ketone
    2 parts by volume primary amyl acetate and
    2 parts by volume ethyl cellosolve
was applied to the pre-treated support and dried. The resulting light sensitive material was exposed imagewise under a half-tone positive original and was then developed with the following solution:
  0.87 parts sodium hydroxide
  7.06 parts sodium silicate solution BE' 58.5°
  92.07 parts water

EXAMPLE 2

An electrolytically grained and anodically oxidized aluminum plate having an oxide layer weighing about 3 g/m² was treated according to U.S. Pat. No. 4,446,221 and coated with a solution of the following preparation
  3.3 parts naphthoquinone diazide sulfonic acid ester (Component No. 3)
  6.2 parts phenol/formaldehyde novolac having a melting range of 110°–120° C., according to DIN 53181 (PN-430 Hoechst A.G.)
  0.2 parts of ESTANE 5715 (Goodrich)
  0.2 parts of Victoria Blue BO
  90.1 parts of a solvent mixture described in Ex. 1 and was dried. The light sensitive material was exposed and developed as in Example 1.

EXAMPLE 3

Substrate according to Example 1 was coated with a solution of
  3.0 parts of napthoquinone diazide sulfonic acid ester (Component No. 2)
  6.5 parts phenol/formaldehyde novolac having a melting range of 110°–120° C. according to DIN 53181 (PN-430-Hoechst A.G.).
  0.2 parts of ESTANE 5715 (Goodrich)
  0.2 parts of Victoria Blue BO
  90.1 parts of a solvent mixture described in Ex. 1 and dried. The light sensitive material was exposed and developed as in Example 1.

EXAMPLE 4

Substrate according to Example 1 was coated with a solution of
  3.3 parts of naphthoquinone diazide sulfonic acid ester (Component No. 1)
  6.2 parts phenol/formaldehyde novolac, having a melting range of 110°–120° C. according to DIN 53181 (PN-430-Hoechst A.G.)
  0.2 parts of ESTANE 5715 (Goodrich)
  0.2 parts of Victoria Blue BO
  90.1 parts of solvent mixture described in Ex. 1 and dried. The light sensitive material was exposed and developed as in Example 1.

EXAMPLE 5

Substrate according to Example 1 was coated with a solution of:
  2.55 parts of naphthoquinone diazide sulfonic acid ester (Component 5)

6.95 parts of phenol/formaldehyde novolac, having a melting range of 110°-120° C. according to DIN 53181-(PN-430-Hoechst A.G.)

0.20 parts of ESTANE 5715 (Goodrich)

0.20 parts of Victoria Blue BO 90.10 parts of a solvent mixture described in Ex. 1 and dried. The light sensitive material was exposed and developed as in Example 1.

TABLE B

| Examples | Component | Exposure Speed in Units (1) | Developing Speed in Sec. (2) | Soakloss in % (3) |
|---|---|---|---|---|
| 4 | 1 | 40 | 20 | 15 |
| 3 | 2 | 25 | 10 | 40 |
| 2 | 3 (APS I) | 20 | 10 | 5 |
| 1 | 4 (APS II) | 20 | 10 | 5 |
| 5 | 5 (APS II-4DC) | 20 | 10 | 5 |

(1) Exposure Speed 5KW Metal Halide lamp, IM Distance United to step 4 open using a Stauffer Grayscale OD 0.15 Development: 2 minutes tray development. Temp. 20° C. Developer described in Example 1.
(2) Developing Speed Time in seconds in which the developer (see Example 1) removes the exposed light sensitive layer.
(3) Soakloss The soakloss is measured as the alkali resistance of the unexposed light sensitive layer by soaking the unexposed light sensitive material for 4 minutes in developer-described in Example 1. Temperature is 20° C. Coating weight is 2.25g/m².

It will be understood that the above embodiments are illustrative only and that the present invention is subject to variations and modifications without departing from its broader aspects.

Thus, it would occur to those skilled in the art that a diester as disclosed in U.S. Pat. No. 3,398,165 (8/20/68) of the type

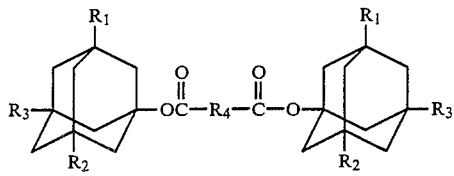

can be reached by the procedures disclosed herein to yield the bis phenol in the $R_3$ positions and subsequently reacted with a naphthoquinone diazide sulphonyl chloride to prepare the light sensitive compound, the o-napthoquinone diazide of the diester. Also as disclosed in U.S. Pat. No. 3,342,880, (9/19/67) with 3,3'-di-(p-hydroxyphenyl)-1,1'-biadamantane can be reacted with an o-napthoquinone diazide sulfonyl chloride to prepare the light sensitive compound bis-o-napthoquinone sulfonyl bis phenol biadamantane.

What is claimed is:

1. A compound having the structural formula

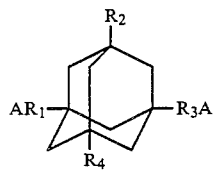

wherein, $R_2$ and $R_4$ are hydrogen or an alkyl group having from 1 to 20 carbon atoms;

wherein $R_1$ and $R_3$ may be the same or different and are hydrogen,

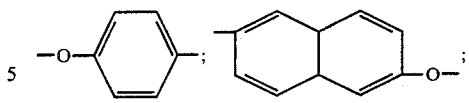

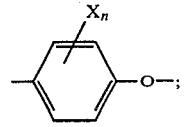

except that $R_1$ and $R_3$ may not both be hydrogen, and where X is a halogen and n is 1 to 4; and wherein A is a quinone diazide from the group consisting of

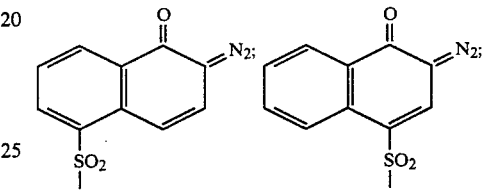

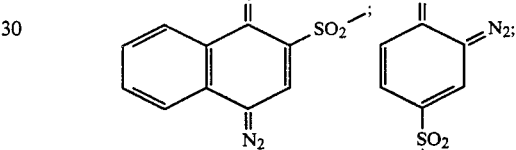

2. The compound of claim 1 wherein $R_2$ and $R_4$ are a lower alkyl group.

3. The compound of claim 1 wherein $R_2$ and $R_4$ are methyl.

4. A composition comprising a photosensitizer suitable for use in making lithographic printing surfaces, which is the reaction product of (a) an adamantane and (b) a diazo; said reaction product having the structural formula

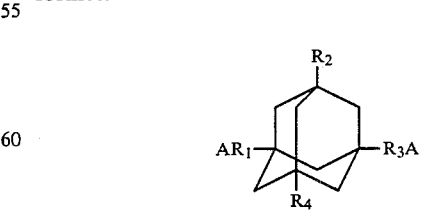

wherein, $R_2$ and $R_4$ are hydrogen or an alkyl group having from 1 to 20 carbon atoms;

wherein $R_1$ and $R_3$ may be the same or different and are hydrogen,

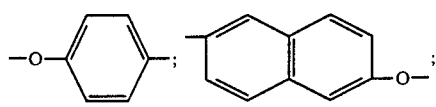

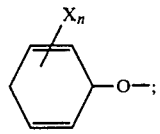

except that R₁ and R₃ may not both be hydrogen, and where X is a halogen and n is 1 to 4; and wherein A is a quinone diazide from the group consisting of

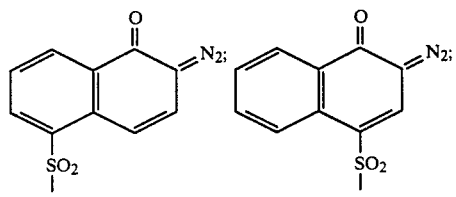

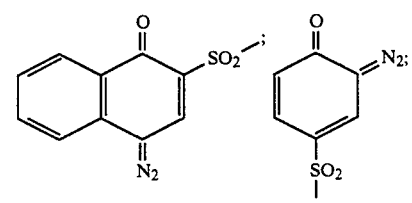

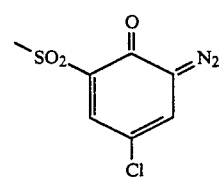

5. In the photosensitizer of claim 4 wherein $R_2$ and $R_4$ are a lower alkyl.

6. In the photosensitizer of claim 5 wherein the lower alkyl group is methyl.

7. In the photosensitizer of claim 4 wherein said diazo is a positive-working diazo.

8. A lithographic plate comprising a base support and a photosensitive composition comprising an adamantane derivative having the formula

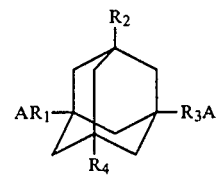

wherein, $R_2$ and $R_4$ are hydrogen or an alkyl group having from 1 to 20 carbon atoms;

wherein $R_1$ and $R_3$ may be the same of different and are hydroggen;

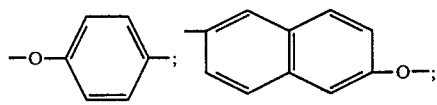

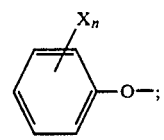

except that $R_1$ and $R_3$ may not both be hydrogen, and where X is a halogen and n is 1 to 4; and wherein A is a quinone diazide from the group consisting of

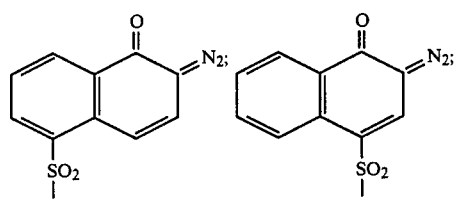

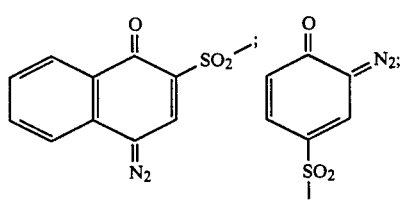

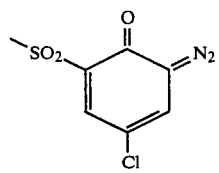

9. The lithographic plate of claim 8 wherein the base support is metallic aluminum.

* * * * *